United States Patent [19]
Paisley et al.

[11] Patent Number: 5,489,871
[45] Date of Patent: Feb. 6, 1996

[54] METHOD AND CIRCUIT FOR REDUCING DISTORTION IN A FILTERED SIGNAL

[75] Inventors: Ian Paisley, Aurora; Stefan R. Hlibowicki, Scarborough, both of Canada

[73] Assignee: Audio Products International Corp., Scarborough, Canada

[21] Appl. No.: 234,692

[22] Filed: Apr. 29, 1994

[51] Int. Cl.$^6$ ........................................... H03K 5/00
[52] U.S. Cl. ..................... 327/551; 333/172; 455/306; 327/552
[58] Field of Search ..................... 327/551, 552, 327/555, 556, 557, 558, 559; 333/14, 172; 381/106; 455/306, 307

[56] References Cited

U.S. PATENT DOCUMENTS

| | | | |
|---|---|---|---|
| 4,223,181 | 9/1980 | Simeau | 333/174 |
| 4,760,602 | 7/1988 | Gibson et al. | 333/14 |
| 4,931,743 | 6/1990 | Fukuda et al. | 322/551 |

*Primary Examiner*—Timothy P. Callahan
*Assistant Examiner*—Dinh T. Le
*Attorney, Agent, or Firm*—Bereskin & Parr

[57] ABSTRACT

A method and circuit for achieving reduced signal distortion in a filtered signal. The method involves connecting an input signal to a main path and a side chain path. The signal carried on the side chain path is then processed to generate a complementary signal which, when combined with the input signal carried by the main path, will produce a target output signal. The circuit includes a side chain processing stage, having a filter stage and a first subtraction stage, and a final processing stage. The input signal is carried on the side chain path to a filter path and a processing path. The signal carried on the filter path is filtered through the filter stage to generate a first filtered signal. The first filtered signal is then subtracted from the input signal on the processing path at the first subtraction stage to generate a complementary processed signal. The complementary processed signal is then subtracted from the input signal on the main path to generate the target output signal. The method and circuit achieve reduced signal distortion by performing the filtering functions on the side chain path and only subjecting the output signal to a single processing stage (at the final processing stage).

13 Claims, 3 Drawing Sheets

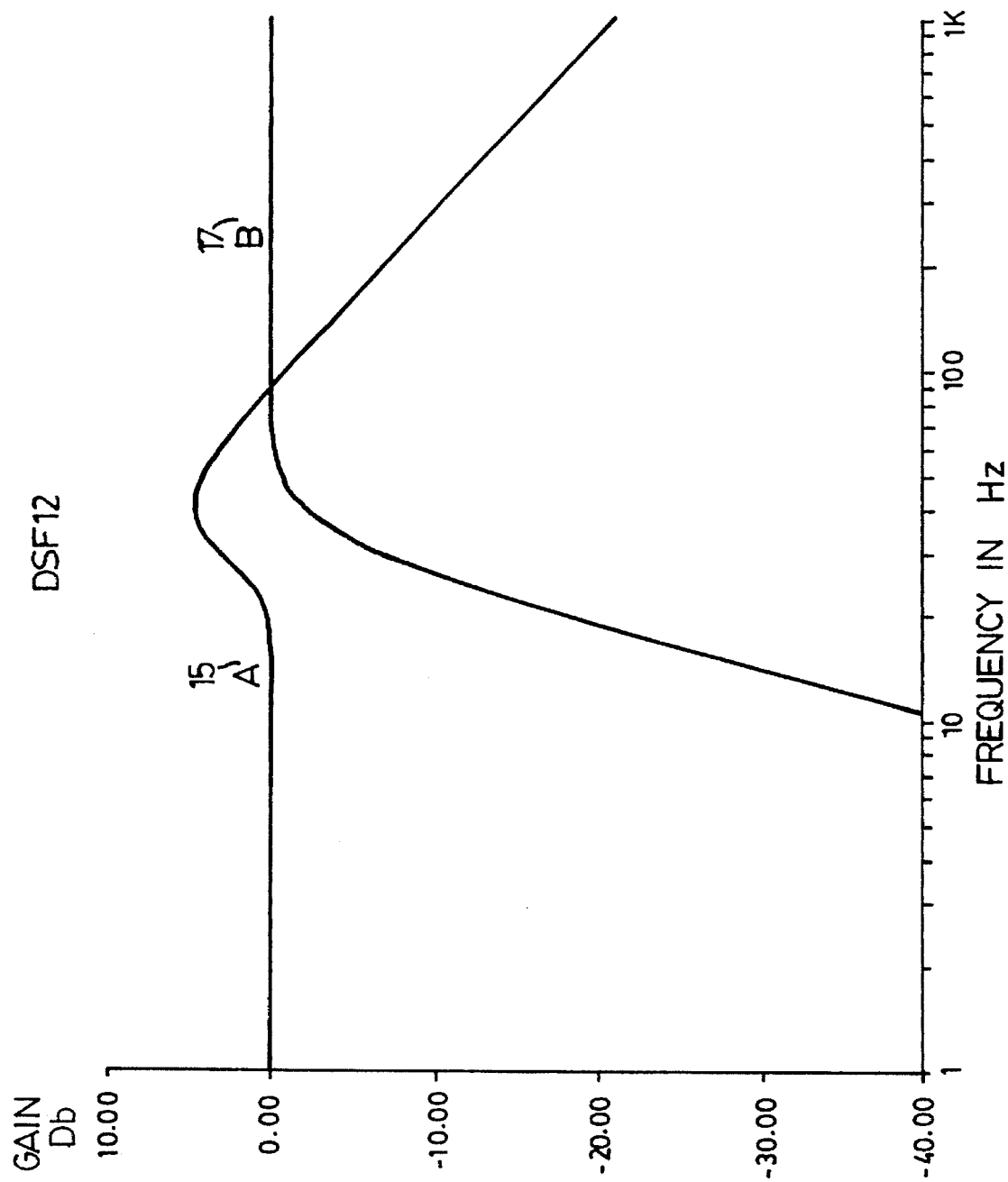

METHOD AND CIRCUIT FOR REDUCING DISTORTION IN A FILTERED SIGNAL

FIELD OF THE INVENTION

The present invention relates to filter networks and in particular to networks where it is important to minimize signal distortion caused by multiple filtering stages.

BACKGROUND OF THE INVENTION

The analog active filter is one of the basic elements of modern audio electronic equipment. The filter's low cost and accuracy make it a preferred choice in many designs. Typically, the final active filter is generated by a cascade connection of many simple active filters and is thus known as a multi-cascade filter. A problem with the multi-cascade filter is that the input signal passes through multiple amplification stages, each stage introducing a degree of signal distortion. In conventional high quality audio systems, the resulting overall signal distortion is considered to be unacceptable.

what is needed is an improved active filter network that exhibits a smaller overall signal distortion than normally present in conventional multi-cascade filters. At the same time, the improved network would maintain the advantages of low cost and accuracy found with conventional networks.

SUMMARY OF THE INVENTION

The Laplace transform of the output signal $S_{out}(s)$ of a filter can be represented as a product of the Laplace transform of the input signal $S_{in}(s)$ and the transfer function $F(s)$ of the filter. This relationship is represented by equation (1) below:

$$S_{out}(s)=S_{in}(s)*F(s) \quad (1)$$

The present invention recognizes that two mathematical equivalents to equation (1) are provided by equations (2) and (3) below:

$$S_{out}(s)=S_{in}(s)*[1-(1-F(s))] \quad (2)$$

$$S_{out}(s)=S_{in}(s)*[1+(F(s)-1)] \quad (3)$$

The present invention further recognizes that there are important practical applications of such equivalent equations. In particular, the equations demonstrate that it is possible to achieve the same filtering as equation (1) by subtracting from, or adding to, the input signal a signal that has been passed through a filter having the transfer function $(1-F(s))$ or $(F(s)-1)$ respectively. In this way, the input signal passes through only one amplification stage while the signal to be filtered out goes through multiple amplification stages. Consequently, the output signal has minimum distortion. It has been found that this approach is particularly useful for high pass filtering.

In one aspect, the invention provides a method for filtering an input signal to generate an output signal modified by a desired target transfer function, said method comprising the steps of:

(a) processing the input signal by implementing a transfer function that is complementary to the target transfer function in order to generate a complementary processed signal; and (b) combining said complementary processed signal with said input signal to produce said output signal.

In another aspect, the invention provides a circuit for filtering an input signal to generate an output signal modified by a desired target function, the circuit comprising:

processing means for processing the input signal to implement a transfer function that is complementary to the target transfer function in order to generate a complementary processed signal; and combining means for combining said complementary processed signal with the input signal to produce the output signal.

BRIEF DESCRIPTION OF THE DRAWINGS

For a better understanding of the present invention and to show more clearly how it may be carried into effect, reference will now be made, by way of example, to the accompanying drawings. The drawings show a preferred embodiment of the present invention, in which:

FIG. 5 is a graph showing a comparison of the respective output signals at the first subtraction stage and the final processing stage of the circuit of FIG. 3.

DETAILED DESCRIPTION OF THE PREFERRED EMBODIMENT

Figure 1:
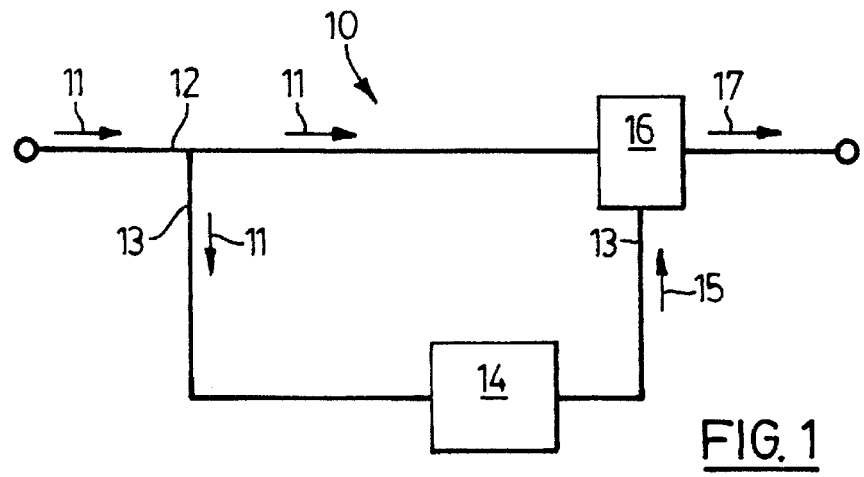
FIG. 1 is a block diagram depicting a general method of reducing signal distortion in a filter network in accordance with the present invention.

FIG. 1 is a block diagram depicting a general method for minimizing signal distortion in a filter network in accordance with the present invention. As shown, an input signal 11 is introduced to a filter network 10 and carried along a main path 12. A side chain path 13 branches in a closed loop from the main path 12. The signal 11 carried on the side chain path 13 is processed at a side chain processing stage 14 to generate a complementary processed signal 15. The complementary processed signal 15 is then carried on the side chain path 13 and combined at a final processing stage 16 with the input signal 11 carried by the main path 12 to produce an output signal 17 modified by the desired target transfer function.

The output signal 17 can be represented by the following Laplace transform equation:

$$S_{out}(s)=S_{in}(s)*F(s) \quad (1)$$

where $S_{out}(s)$ is the Laplace transform of the output signal 17, $S_{in}(s)$ is the Laplace transform of the input signal 11, and $F(s)$ is the target transfer function required to generate the output signal 17.

According to the present invention, the transfer functions that are implemented at the side chain processing stage 14 and the final processing stage 16 are selected to achieve the desired target transfer function.

As described earlier, two mathematical equivalents to equation (1) are provided by equations (2) and (3) below:

$$S_{out}(s)=S_{in}(s)*[1-(1-F(s))] \quad (2)$$

$$S_{out}(s)=S_{in}(s)*[1+(F(s)-1)] \quad (3)$$

The transfer functions for processing stages 14 and 16 can be determined from either of equations (2) or (3). For instance, according to equation (2), the transfer function implemented at the side chain processing stage 14 would be (1−F(s)), and the transfer function implemented at the final processing stage 16 would be [1− (1−F(s))]. Similarly, according to equation (3), the transfer function implemented at the side chain processing stage 14 would be (F(s)−1), and the transfer function implemented at the final processing stage 16 would be [1+ (F(s)−1)].

The transfer function occurring at the side chain processing stage 14 is conveniently described herein as a complementary transfer function. Thus, functions (1−F(s)) and (F(s)−1) are complementary transfer functions according to equations (2) and (3) above.

The complementary transfer function is defined, in this specification including the claims, to be any transfer function for processing an input signal to give a complementary output signal, where the complementary transfer function and the target transfer function may be combined to give unity. The invention recognizes that there may be a positive complementary transfer function as given by (1−F(s)) in equation (2) which may be added to the target transfer function F(s) to give unity, or alternatively a negative complementary transfer function as given by (F(s)−1) in equation (3) which may be subtracted from the target transfer function F(s) to give unity.

It will further be appreciated that an input signal processed by the complementary transfer function will correspondingly generate a positive or negative complementary output signal which can be added to or subtracted from the output signal, to give the original input signal.

While equations (2) and (3) provide useful examples of complementary transfer functions, it will be understood that alternative complementary transfer functions may be obtained for alternative mathematical equivalents to equation (1). Such alternative complementary transfer functions are also intended to fall within the spirit of the present invention.

Figure 2:
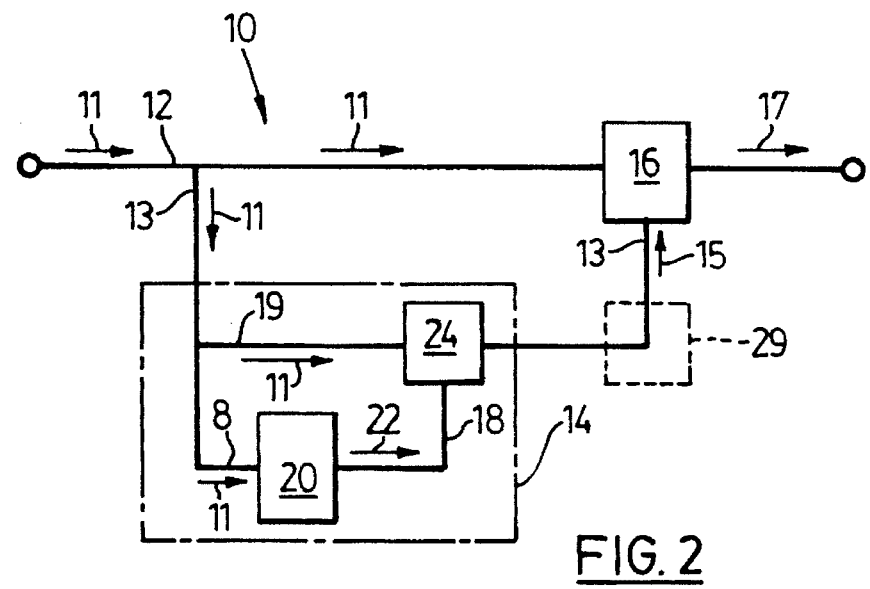
FIG. 2 is a block diagram depicting one approach for carrying out the method of FIG. 1.

Referring to FIG. 2, a block diagram showing one embodiment for realizing equation (2) is provided. As may be seen in FIG. 2, the input signal 11 is connected to the main path 12 and the side chain path 13. The input signal 11 carried by the side chain path 13 is further branched into a filter path 18 and a processing path 19.

The input signal 11 carried on the filter path 18 is introduced to a primary filter stage 20. The primary filter stage 20 acts to filter the signal, for instance by passing the signal through a cascade connection of many simple active filters (i.e. a multi-cascade filter). The target transfer function of filter stage 20 is given by F(s).

The signal generated by the primary filter stage 20, described herein as a first filtered signal 22, is then connected by the filter path 18 to a first subtraction stage 24, for subtraction from the input signal 11 carried on the processing path 19. Accordingly, the transfer function of first subtraction stage 24 is given by the positive complementary transfer function (1−F(s)).

The signal generated by the first subtractive stage 24, described herein as the complementary processed signal 15, is then carried on the side chain path 13 to the final processing stage 16 for subtraction from the input signal 11 carried on the main path 12. The transfer function of the final processing stage 16 is given by [1−(1− F(s))], which is equivalent to the target transfer function F(s) for obtaining the output signal 17.

The signal generated by the final processing stage 16, described herein as the output signal 17, has thus been filtered with a minimum amount of signal distortion and is ready for further processing as desired. The signal distortion is minimized because the input signal 11 carried by the main path 12 is only subjected to a single processing stage (i.e. at the final processing stage 16). The pass band frequencies of this signal are thus subjected to minimal signal distortion. The frequencies processed through paths 18, 19 are in effect removed in the final processing stage 16. The invention also recognizes the psycho-acoustic effect that any distortion in low frequencies is much less noticeable.

Figure 3:
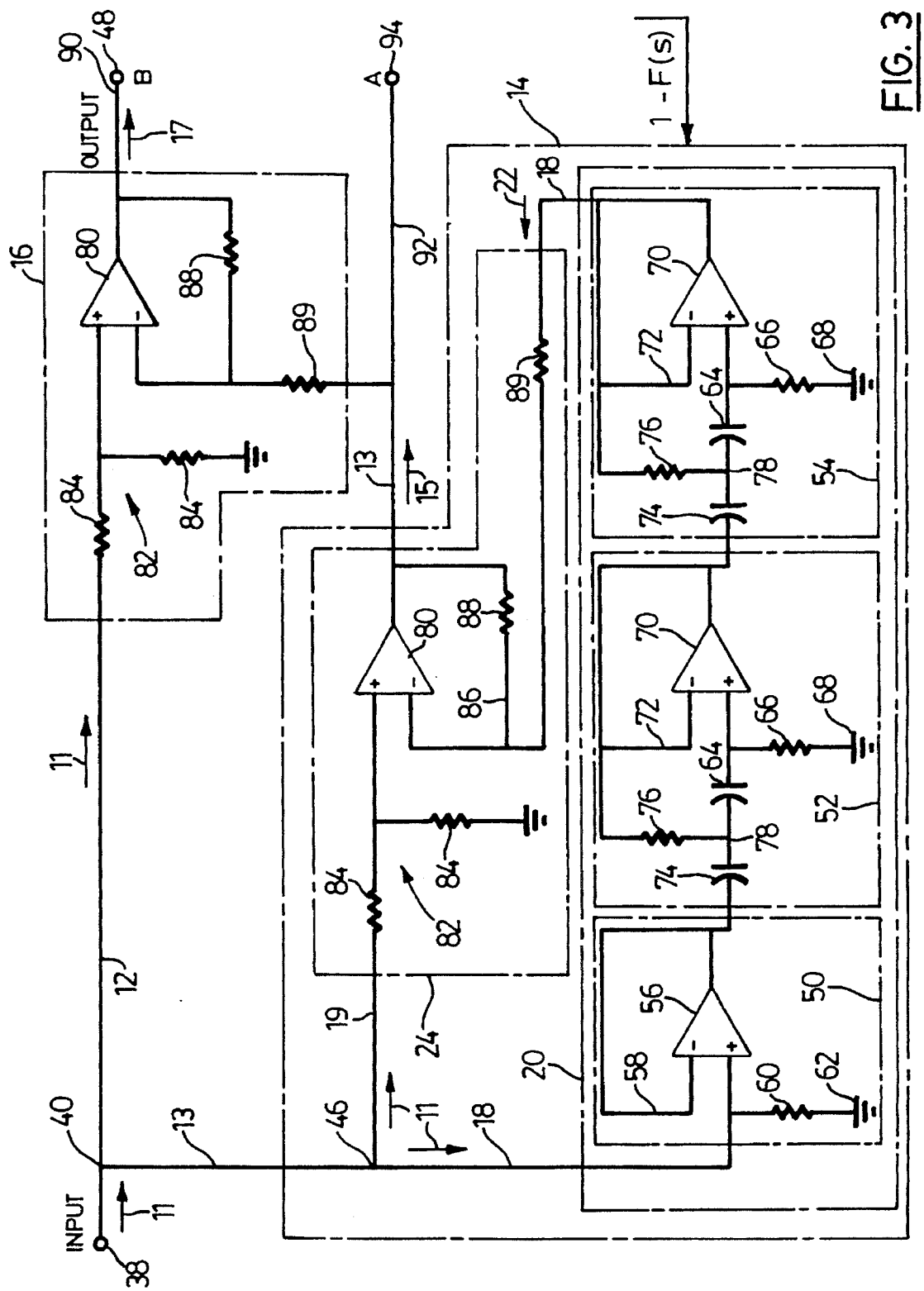
FIG. 3 is a diagram of a circuit realization of the method depicted in FIG. 2.

Referring to FIG. 3, a circuit realization of the filter network 10 is shown corresponding to the block diagram of FIG. 2. The side chain processing stage 14 (comprising the primary filter stage 20 and the first subtraction stage 24), and the final processing stage 16 of the method described above are conducted in the respective portions of the circuit indicated in dotted outline. As will be described further below, the primary filter stage 20 acts as an active high pass filter. It will be appreciated by those skilled in the art that an alternative filter configuration, such as an active low pass filter, may be substituted in this stage.

Referring more specifically to the operation of the circuit, the input signal 11 is connected to the circuit at an input port 38. The signal is then connected at a first junction 40 to the main path 12, leading to the final processing stage 16, and the side chain path 13 leading to side chain processing stage 14. At a second junction 46 on the side chain path the input signal is connected to the filter path 18 leading to the filter stage 20 and the processing path 19 leading to the first subtraction stage 24. Once the signal has passed through the filter stage 20, the filter path 18 recombines with the processing path 19 at the first subtraction stage 24. Once the signal has passed through the first subtraction stage 24, the side chain path 13 is recombined with the main path 12 at the final processing stage 16. The output signal 17 exits the final processing stage 16 and travels to output port 48.

The primary filter stage 70 includes a voltage follower 50 connected in cascade with first and second high pass filters 52 and 54. The voltage follower 50 includes an operational amplifier (op. amp.) 56 having a negative feedback loop 58. A resistor 60 connected to ground 62 branches from the filter path 18 leading to the non-inverting input of the op. amp. 56.

The first and second high pass filters 52, 54 are of equivalent configuration. Each filter is a standard unity gain active filter having an attenuation of 12 db per octave below the breakpoint. Accordingly, the filters each comprise a first capacitor 64 and a first resistor 66, with the resistor 66 being coupled with ground 68. The capacitor 64 and resistor 66 are connected to the non-inverting input of an op. amp. 70. The op. amp. 70 includes a negative feedback loop 72. In addition each filter further includes a second capacitor 74 and a second resistor 76. The second capacitor 74 is connected to the output of the preceding op. amp. The second resistor 76 is connected, at one end, to the negative feedback loop of the succeeding op. amp. At its other end, the second resistor 76 is connected to a junction 78 immediately preceding the R-C network of the respective filters.

The output of the filter stage, i.e. the first filtered signal 22, is connected to the first subtractive stage 24. It will be recognized by those skilled in the art that the first subtraction stage 24 comprises a differential amplifier. In particular, the first subtractive stage 24 includes an op. amp. 80 and a resistive divider 82. The divider comprises a pair of resistors 84 one of which is connected to the ground. The resistive divider 82 is connected to the non-inverting input of the op. amp. 80. The op. amp. 80 includes a negative feedback loop 86 having a resistor 88. The first filtered signal is passed through a resistor 89 before it is introduced to the inverting input of the op. amp. 80. Accordingly, with resistors 84, 88, and 89 having the same value, the resulting signal will be the difference between the two input signals.

The output of the first subtraction stage 24, i.e. the complementary processed signal 15, is connected by the side chain path 13 to the final processing stage 16. The final processing stage 16 includes the same components as the first subtraction stage 24. Accordingly, in this embodiment, the final processing stage 16 comprises a differential amplifier.

Finally, the output signal 17 from the final processing stage 16 is connected by an output path 90 to output port 48.

It will be noted that a reference output path 92 leads from the first subtraction stage 24 to reference output port 94. This permits comparison of the complementary processed signal 15 and the output signal 17 as described further below.

It will now be understood how the circuit 10 operates. If the primary filter stage 20 implements the target transfer function F(s), and the input signal transform is $S_{in}(s)$, then the output transform of this stage 20 will be $S_{in}(s) *F(s)$. This signal is then subtracted from the input signal at the first subtraction stage 24 to implement the complementary transfer function (1−F(s)). The output transform of the first subtraction stage 24 will then be $S_{in}(s) * (1-F(s))$, and consequently the output transform of the final processing stage 16 will be $S_{in}(s) * [1-(1-F(s))]$. As noted earlier, this is equivalent to the output signal 17 as given by equation (1).

Figure 4:
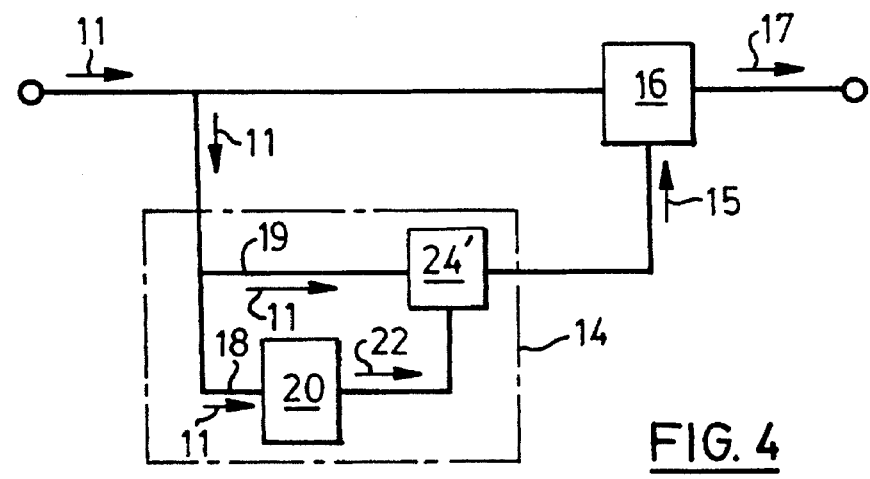
FIG. 4 is a block diagram depicting a second approach for carrying out the method of FIG. 1.

It will be appreciated that a similar circuit may be constructed to realize equation (3) by implementing the negative complementary transfer function (F(s)−1). In such a circuit, a reverse subtractive stage 24' is substituted for the first subtractive stage 24 to generate function $S_n(s)*(F(s)-1)$. Consequently, the final processing stage 16 would be selected to generate function $S_{in}(s)*[1+(F(s)-1)]$. Again, this is equivalent to the output signal 17 given by equation (1). A block diagram depicting such a circuit is provided in FIG. 4.

The performance of the circuit depicted in FIG. 3 is shown in the graph of FIG. 5. Here, line B shows the desired output signal 17 having the target transfer function F(s) of a high pass filter, with a 24 db per octave attenuation at frequencies below the break point. This corresponds to the transfer function implemented at the primary filter stage 20 to generate the first filtered signal 22.

As noted at the outset, the use of a filter such as filter stage 20 by itself would result in signal distortion due to the filtered high frequencies being passed through the multiple amplification stages of filter stage 20. The present invention reduces such signal distortion by conducting the filtering function in a side chain.

When the first filtered signal 22 is subtracted at the first substraction stage 24, the complementary processed signal 15 is obtained, which, as shown by line A, has a slope of 6 db per octave. When this signal is subtracted at the final processing stage 16, the original desired characteristic B for the output signal 17 is obtained. However, the high frequency signals above the break point around 35 Hz have passed solely through the final processing stage 16 with minimal processing. The signals subjected to processing in the filter stage 20 and the first subtraction stage 24 are essentially the low frequency signals represented by curve A. These signals are removed by subtraction in the final processing stage 16.

As shown, line A shows a slower fall off above the break point. For high performance applications, it may be that processing of the higher frequencies will result in distortions in line A, which will show at the output of the final processing stage 16. To further eliminate any such distortions in high frequencies above the break points, an auxiliary high pass filter 29 can be inserted between the first subtraction stage 24 and the final processing stage 16, as indicated by dotted lines in FIG. 2. In effect, this could give a steeper slope to line A. Then, the only signal components passed to the final processing 16 would be the lower frequencies, below the break point, solely for subtraction from the original signal. While this would effectively modify the target transfer function F(s), allowance can be made for this.

It is to be understood that what has been described is a preferred embodiment of the invention. The invention is nonetheless susceptible to certain changes and alternative embodiments fully comprehended by the spirit of the invention as described above, and the scope of the claims set out below. For instance, while the circuit depicted is directed to high pass filtering, the inventive method may equally be applied to other filtering needs, such as low pass filtering.

We claim:

1. A method of processing an input signal by a desired target transfer function, to generate an output signal, said method comprising the steps of:
   (a) filtering said input signal to produce a first filtered signal having the desired target transfer function;
   (b) subtracting said first filtered signal from said input signal to produce a complementary processed signal as a positive complementary signal; and
   (c) subtracting said positive complementary signal from the input signal to produce said output signal.

2. A method of processing an input signal by a desired target transfer function, to generate an output signal, said method comprising the steps of:
   (a) filtering said input signal to produce a first filtered signal having the desired target transfer function;
   (b) subtracting said input signal from said first filtered signal to produce a complementary processed signal as a negative complementary signal; and
   (c) adding the negative complementary signal to the input signal to produce said output signal.

3. The method as claimed in claims 1 or 2, wherein said filtering step implements the target transfer function.

4. The method according to claim 3, wherein said complementary processed signal is subject to further filtering prior to step (b).

5. A circuit for processing an input signal by a desired target transfer function, to generate an output signal, the circuit comprising: processing means for processing the input signal to implement a transfer function that is complementary to the target transfer function in order to generate a complementary processed signal, the processing means including a filter stage for producing a first filtered signal having the desired target transfer function and a first subtraction stage for subtracting said first filtered signal from said input signal to produce a positive complementary signal, and a combining means for subtracting the complementary processed signal from the input signal to produce the output signal.

6. A circuit for processing an input signal by desired target transfer function, to generate an output signal, the circuit comprising: processing means for processing the input signal to implement a transfer function that is complementary to the target transfer function in order to generate a complementary processed signal the processing means including a filter stage for producing a first filtered signal and a first subtraction stage for subtracting said input signal from said first filtered signal to produce a negative complementary signal, and a combining means for adding the complementary processed signal to the input signal to produce the output signal.

7. The circuit as claimed in claims 5 or 6, wherein said filter stage implements the target transfer function.

8. The circuit as claimed in claim 7, wherein said first subtraction stage comprises a differential amplifier.

9. The circuit as claim in claim 8, wherein said combining means comprises a final processing stage having a differential amplifier.

10. The circuit as claimed in claim 9, wherein said filter stage includes a multi-cascade filter.

11. The circuit as claimed in claim 10, wherein said multi-cascade filter comprises an active high pass filter.

12. The circuit as claimed in claim 11, wherein said filter comprises a plurality of R-C networks.

13. The circuit as claimed in claim 12, wherein a voltage follower is connected to said plurality of R-C networks.

\* \* \* \* \*